US011531267B2

(12) United States Patent
Weng et al.

(10) Patent No.: US 11,531,267 B2
(45) Date of Patent: Dec. 20, 2022

(54) IMPRINTING APPARATUS

(71) Applicant: HIMAX TECHNOLOGIES LIMITED, Tainan (TW)

(72) Inventors: Ruei Yu Weng, Tainan (TW); Chung-Ho Tseng, Tainan (TW); Han-Yi Kuo, Tainan (TW); Yin-Tung Lu, Tainan (TW); Jui Pin Tsai, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 17/325,211

(22) Filed: May 20, 2021

(65) Prior Publication Data

US 2022/0004097 A1 Jan. 6, 2022

(30) Foreign Application Priority Data

Jul. 2, 2020 (TW) ................................. 109122406
May 6, 2021 (TW) ................................. 110116314

(51) Int. Cl.
*G03F 7/00* (2006.01)
(52) U.S. Cl.
CPC .................................. *G03F 7/0002* (2013.01)
(58) Field of Classification Search
CPC ..... G03F 7/0002; B29C 59/046; B29C 59/04; B41F 16/002
See application file for complete search history.

(56) References Cited

U.S. PATENT DOCUMENTS

2013/0241096 A1* 9/2013 Shudo .................. B29C 59/022
264/40.5
2014/0252679 A1 9/2014 Hwang et al.
(Continued)

FOREIGN PATENT DOCUMENTS

| CN | 107000308 | 8/2017 |
| CN | 107428538 | 12/2017 |

(Continued)

OTHER PUBLICATIONS

"Office Action of Japanese Counterpart Application", dated May 9, 2022, p. 1-p. 4.

(Continued)

*Primary Examiner* — Seyed Masoud Malekzadeh
*Assistant Examiner* — John W Hatch
(74) *Attorney, Agent, or Firm* — JCIPRNET

(57) ABSTRACT

An imprinting apparatus includes an imprinting platform having a first side and a second side opposite to each other, an imprinting roller disposed above the imprinting platform, a transfer module, and a film separation module. The transfer module includes a transfer film located between the imprinting roller and the imprinting platform and a fixed frame fixed beside the first side of the imprinting platform and a movable frame disposed on the second side of the imprinting platform that clamp opposite sides of the transfer film. The movable frame is adapted to move horizontally relative to the fixed frame to change a flatness of the transfer film. The film separation module is connected to the movable frame, and is adapted to drive the movable frame to be turned from a first position to a second position, such that a rounded corner is formed between the transfer film and the imprinting roller.

14 Claims, 11 Drawing Sheets

(56) References Cited

U.S. PATENT DOCUMENTS

| | | | | |
|---|---|---|---|---|
| 2017/0320244 A1* | 11/2017 | Heidari | ............... | B29C 37/0017 |
| 2019/0176500 A1* | 6/2019 | Lindner | ................... | B41K 3/14 |
| 2019/0361340 A1* | 11/2019 | Yu | ......................... | G03F 7/0002 |
| 2019/0377258 A1* | 12/2019 | Yu | ......................... | G03F 7/0002 |

FOREIGN PATENT DOCUMENTS

| | | | | |
|---|---|---|---|---|
| CN | 111208708 | | 5/2020 | |
| EP | 3037236 | | 6/2016 | |
| JP | 2007019451 | | 1/2007 | |
| JP | 2014054735 | | 3/2014 | |
| JP | 2019531921 | | 11/2019 | |
| TW | 200604730 | | 2/2006 | |
| TW | 201634295 | | 10/2016 | |
| TW | 201811538 | | 4/2018 | |
| WO | WO-2013126750 A1 * | 8/2013 | ............. | B29C 59/02 |

OTHER PUBLICATIONS

"Office Action of Taiwan Counterpart Application", dated Nov. 25, 2021, p. 1-p. 10.
"Search Report of Europe Counterpart Application", dated Dec. 15, 2021, p. 1-p. 5.

\* cited by examiner

IMPRINTING APPARATUS

CROSS-REFERENCE TO RELATED APPLICATION

This application claims the priority benefit of Taiwanese application no. 109122406, filed on Jul. 2, 2020, and Taiwanese application no. 110116314, filed on May 6, 2021. The entirety of each of the above-mentioned patent applications is hereby incorporated by reference herein and made a part of this specification.

BACKGROUND

Technical Field

The disclosure relates to an imprinting apparatus; particularly, the disclosure relates to an imprinting apparatus with a relatively high yield of products.

Description of Related Art

Currently, after imprinting is completed on a nanoimprinting machine, separation between a transfer film and a product is mostly by lifting the transfer film located above the imprinting platform and pulling it slowly to separate from the product. However, the above-mentioned is not adaptive to resist and parameter changes of the product, and thus the imprinted product structure may be damaged due to the film separation process, thereby reducing the imprinting yield of products.

SUMMARY

The disclosure is directed to an imprinting apparatus, which increases an imprinting yield and operating convenience.

According to an embodiment of the disclosure, the imprinting apparatus includes an imprinting platform, an imprinting roller, a transfer module, and a film separation module. The imprinting platform has a first side and a second side opposite to each other. The imprinting roller is disposed above the imprinting platform. The transfer module includes a transfer film and a fixed frame and a movable frame that clamp opposite sides of the transfer film. The transfer film is located between the imprinting roller and the imprinting platform. The fixed frame is fixed beside the first side of the imprinting platform. The movable frame is disposed on the second side of the imprinting platform. The movable frame is adapted to move horizontally relative to the fixed frame to change a flatness of the transfer film. The film separation module is connected to the movable frame of the transfer module, and is adapted to drive the movable frame to be turned from a first position to a second position, such that a rounded corner is formed between the transfer film and the imprinting roller.

According to an embodiment of the disclosure, the imprinting apparatus also includes two white light interferometers separately disposed beside the first side of the imprinting platform to detect a height between the imprinting roller and the imprinting platform.

According to an embodiment of the disclosure, in the imprinting apparatus, the movable frame of the transfer module includes a first portion, a second portion, and a plurality of elastic elements. The elastic elements are separately connected between the first portion and the second portion. The opposite sides of the transfer film are clamped between the fixed frame and the first portion of the movable frame.

According to an embodiment of the disclosure, in the imprinting apparatus, the elastic elements include a plurality of springs.

According to an embodiment of the disclosure, the imprinting apparatus also includes at least one sensor disposed beside the second portion of the movable frame and configured to detect a tensile force value of the elastic elements.

According to an embodiment of the disclosure, the imprinting apparatus also includes a moving platform, a first pair of sliding rails, and a moving module. The first pair of sliding rails is disposed on the moving platform. The moving module is slidably disposed on the first pair of sliding rails, and includes a carrier and a bracket disposed on the carrier. The bracket includes two first bracket parts opposite to each other and a second bracket part connected to the two first bracket parts. The two first bracket parts each have a bearing slot, and opposite ends of the imprinting roller are respectively disposed in the bearing slots.

According to an embodiment of the disclosure, the imprinting apparatus also includes two sensors respectively disposed in the bearing slots and located between the ends of the imprinting roller and the bearing slots, and configured to measure a pressure value of the imprinting roller.

According to an embodiment of the disclosure, the imprinting apparatus also includes a second pair of sliding rails and an adjustable lead screw. The moving module also includes a support plate disposed on the carrier, the second pair of sliding rails is disposed on the support plate, and the second bracket part is slidably disposed on the second pair of sliding rails. An extension direction of the first pair of sliding rails is perpendicular to an extension direction of the second pair of sliding rails. The adjustable lead screw is connected to the second bracket part and is configured to adjust a height difference between the bracket and the carrier.

According to an embodiment of the disclosure, the imprinting apparatus also includes a plurality of elastic elements separately disposed between the two first bracket parts of the bracket and the carrier.

According to an embodiment of the disclosure, in the imprinting apparatus, the elastic elements include a plurality of compression springs.

According to an embodiment of the disclosure, in the imprinting apparatus, a distance is present between the imprinting platform and the moving platform.

According to an embodiment of the disclosure, the imprinting apparatus also includes a pair of sliding rails disposed beside a third side and beside a fourth side of the imprinting platform, the third side and the fourth side are opposite to each other, and the film separation module is slidably disposed on the pair of sliding rails.

According to an embodiment of the disclosure, in the imprinting apparatus, the film separation module includes a bearing part and a turning mechanism. The movable frame of the transfer module is assembled on the bearing part. The turning mechanism includes two adjustable body parts and two hinge parts connected to the two adjustable body parts. The two hinge parts are respectively connected to opposite sides of the bearing part, and the two adjustable body parts are adapted to slide along the pair of sliding grooves in a first direction and are adapted to move along a second direction perpendicular to the first direction to adjust a distance between the transfer film and the imprinting platform.

According to an embodiment of the disclosure, the imprinting apparatus also includes a tensile force adjustment mechanism. The tensile force adjustment mechanism includes two rotating axles and two lifting machines. An extension direction of the two rotating axles is parallel to an extension direction of the imprinting roller. The two rotating axles are in contact against the transfer film and are respectively located between the fixed frame of the transfer module and the imprinting platform and between the movable frame of the transfer module and the imprinting platform. The two lifting machines respectively adjust lifted heights of the two rotating axles, and the transfer film is pulled open through lifting by the two rotating axles to generate a tensile force.

According to an embodiment of the disclosure, a length of each of the rotating axles is greater than a width of the transfer film.

According to an embodiment of the disclosure, the tensile force adjustment mechanism also includes two tensile force sensors. The two tensile force sensors are respectively disposed between the two rotating axles and the two lifting machines to detect a real-time tensile force of the transfer film.

Based on the foregoing, in the imprinting apparatus of the disclosure, the film separation module is connected to the movable frame of the transfer module, and is adapted to drive the movable frame to be turned from the first position to the second position, such that the rounded corner is formed between the transfer film and the imprinting roller. That is, the film separation module may turn the transfer film fixed with the movable frame and vary the transfer film in multiple angles, such that the imprinted product structure would not be damaged due to improper film separation, thereby increasing the imprinting yield and operating convenience.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
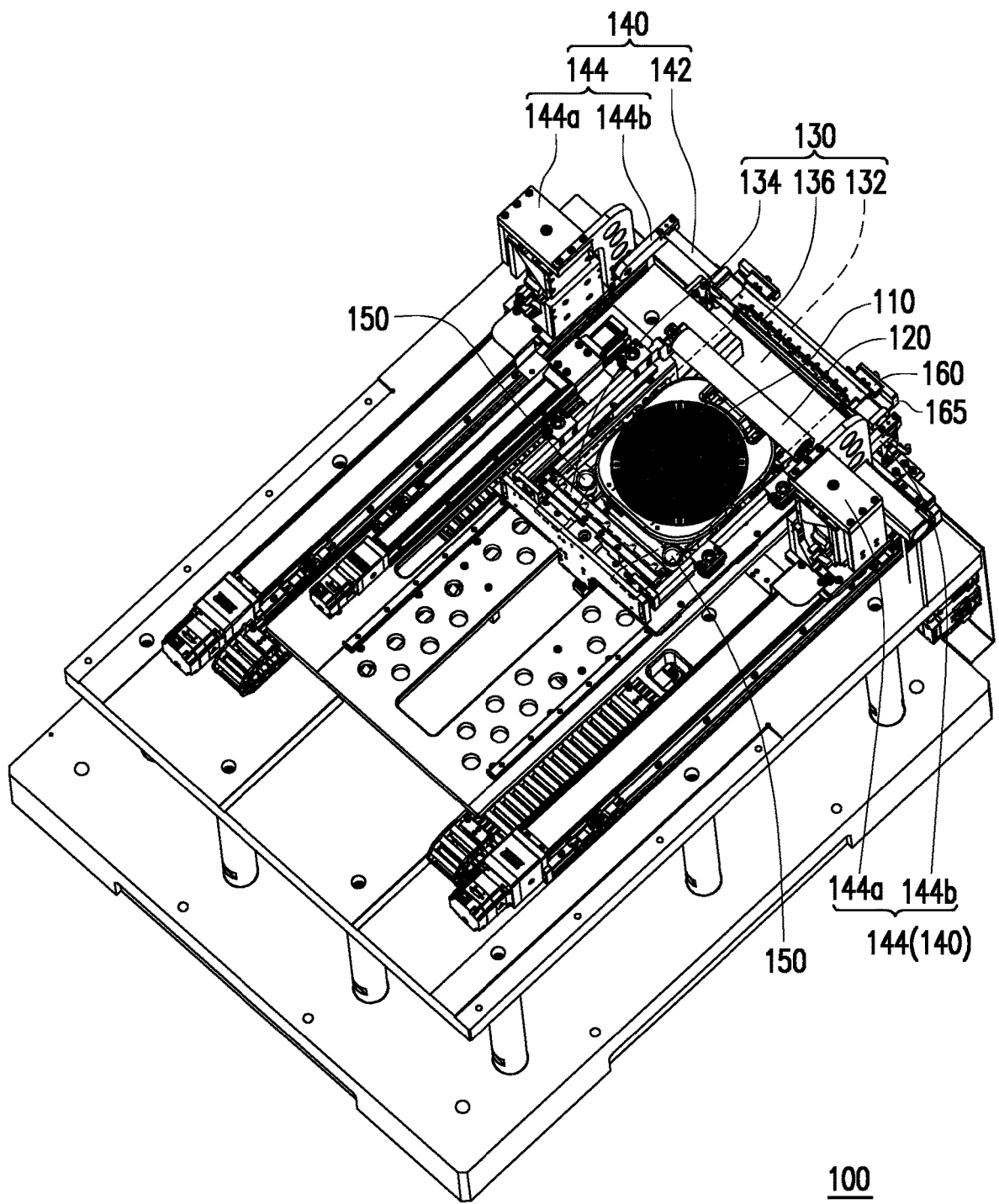
FIG. 1 is a perspective view of an imprinting apparatus according to an embodiment of the disclosure.

Reference will now be made in detail to the exemplary embodiments of the disclosure, examples of which are illustrated in the accompanying drawings. Wherever possible, the same element symbols are used in the drawings and description to denote the same or similar parts.

Figure 2A:
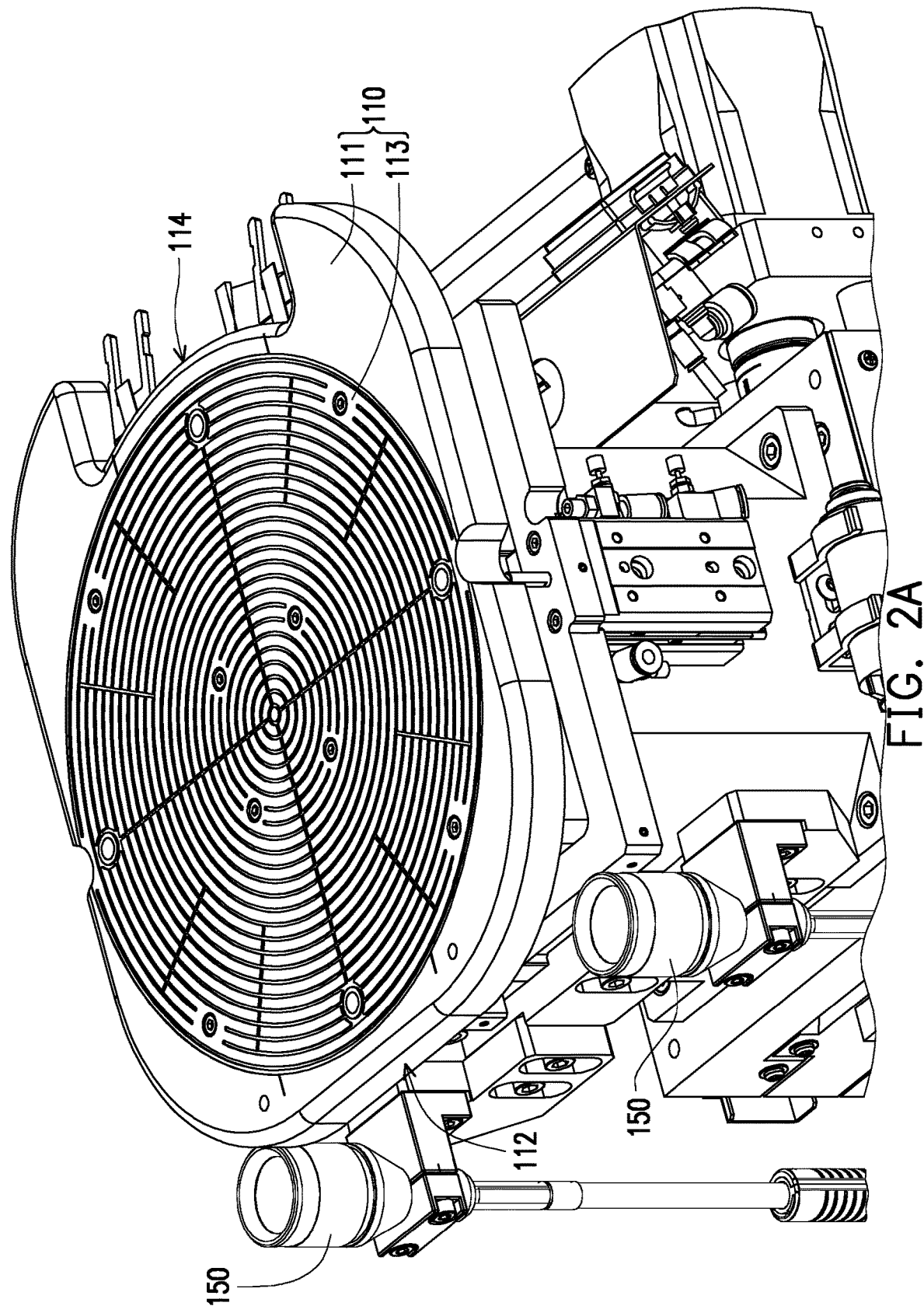
FIG. 2A is a perspective view of an imprinting platform and a white light interferometer in the imprinting apparatus of FIG. 1.
Figure 2B:
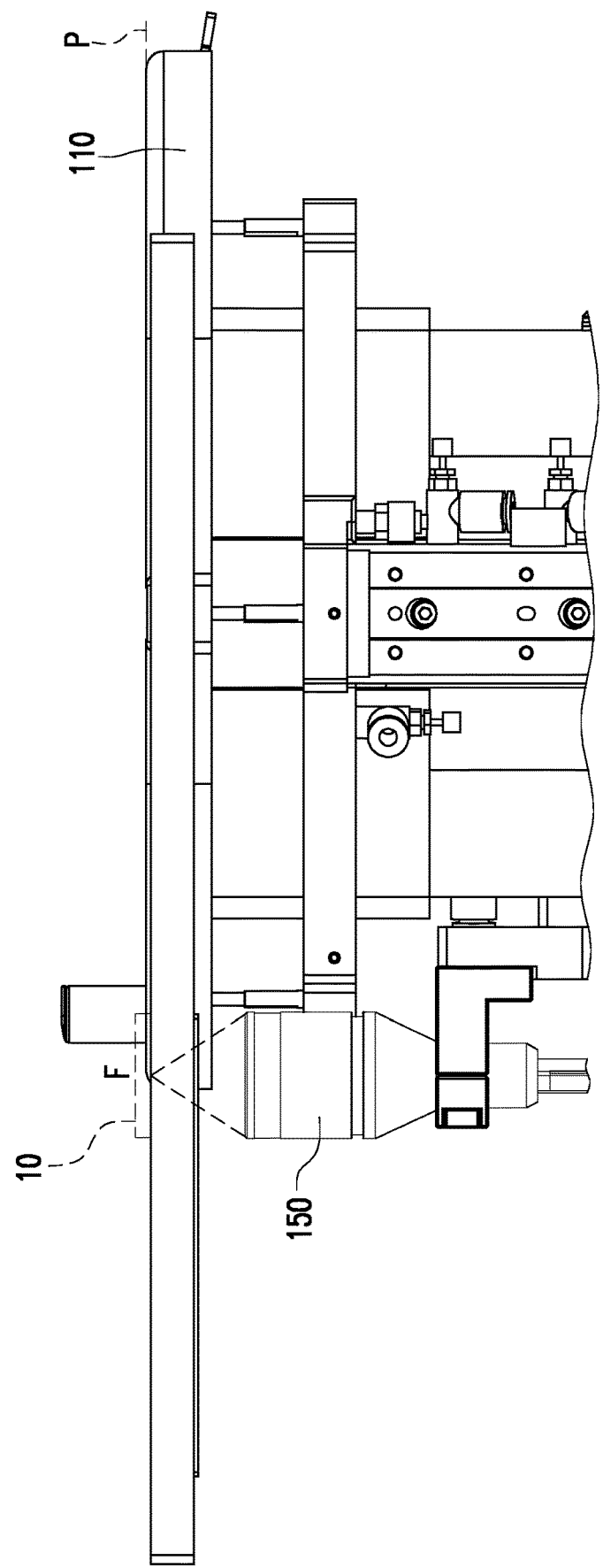
FIG. 2B is a side view of FIG. 2A.
Figure 3:
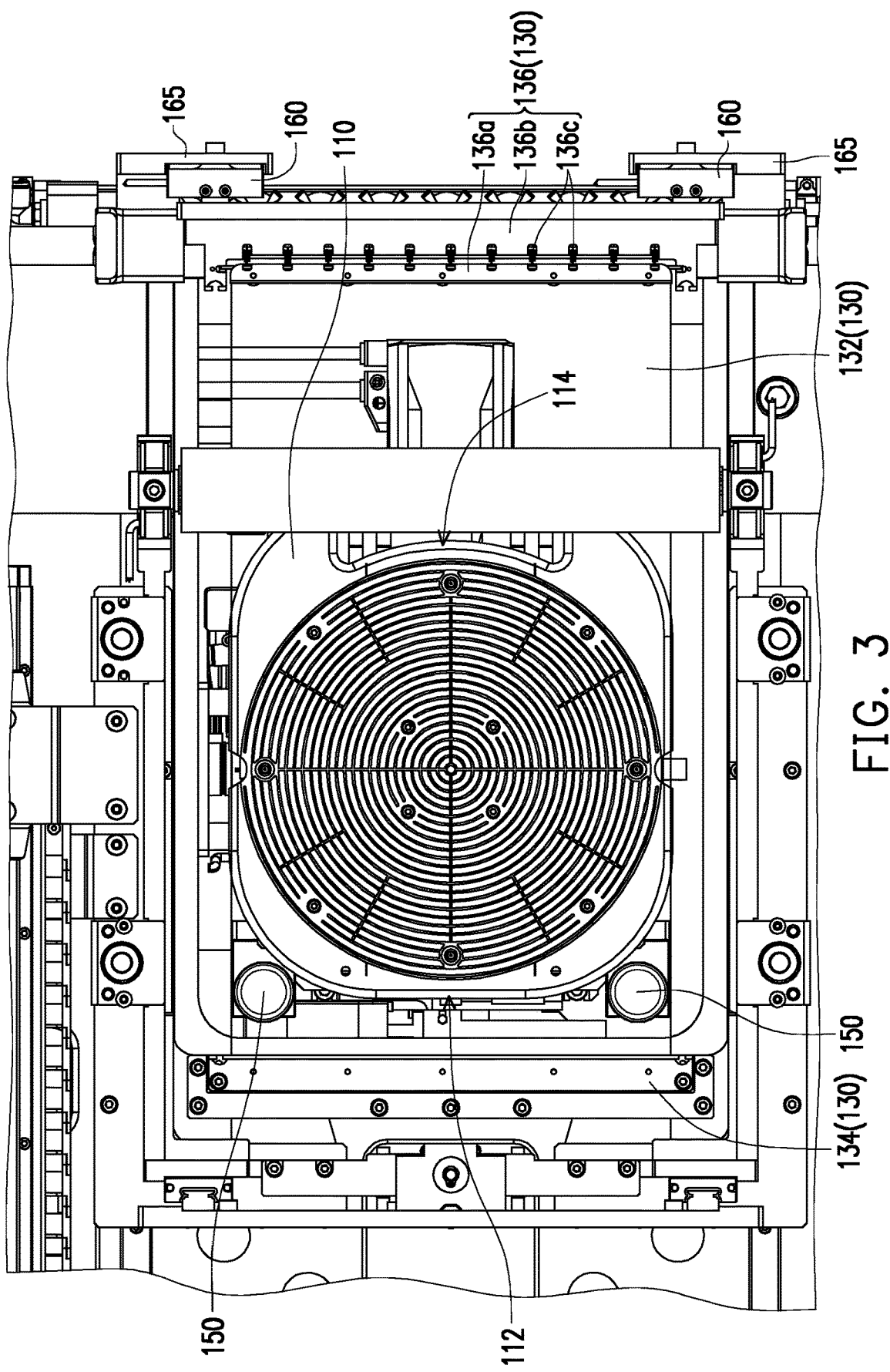
FIG. 3 is a partial top view of the imprinting apparatus of FIG. 1.
Figure 4A:
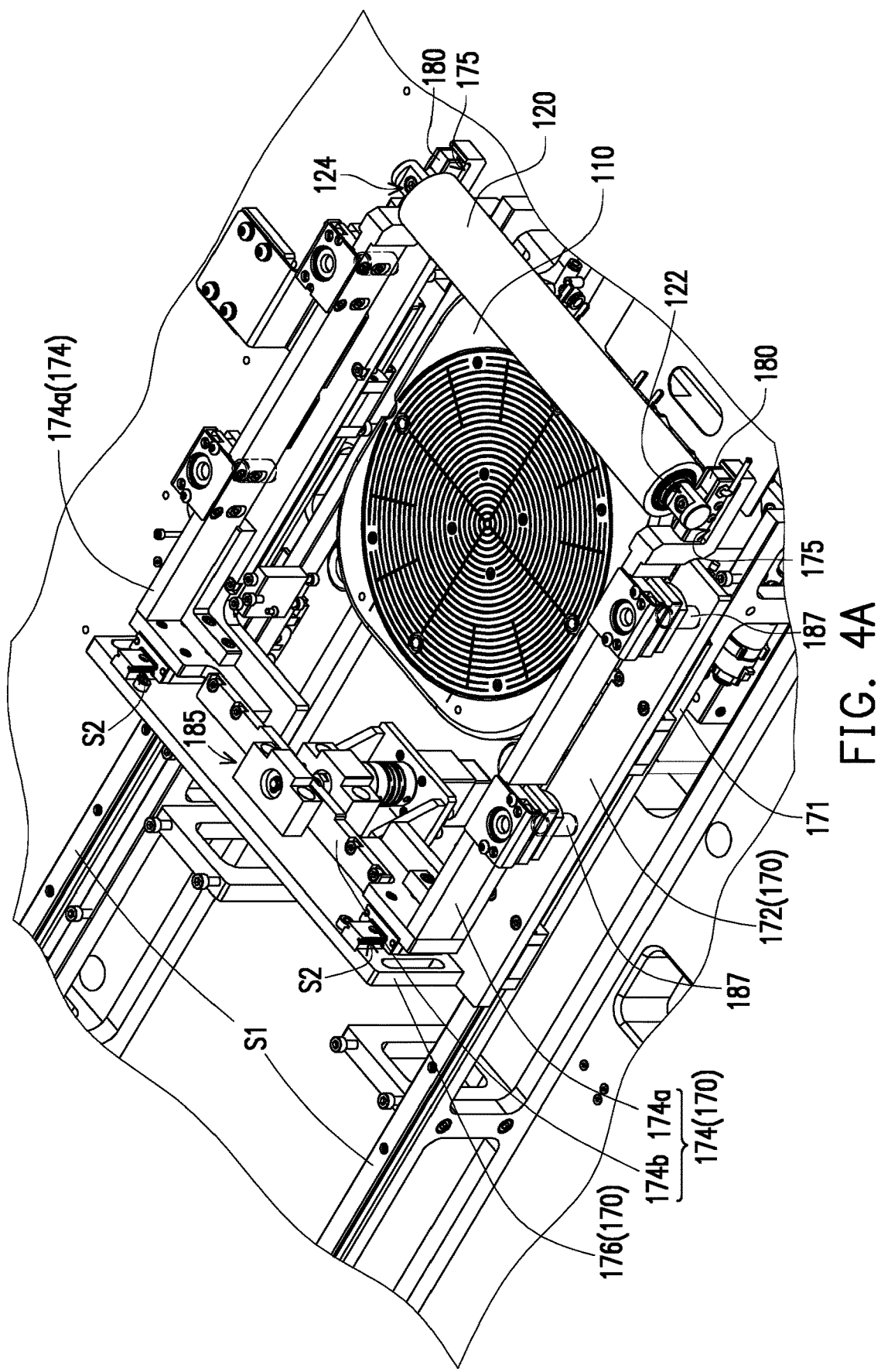
FIG. 4A is a partially enlarged perspective view of the imprinting apparatus of FIG. 1 from another view angle.
Figure 4B:
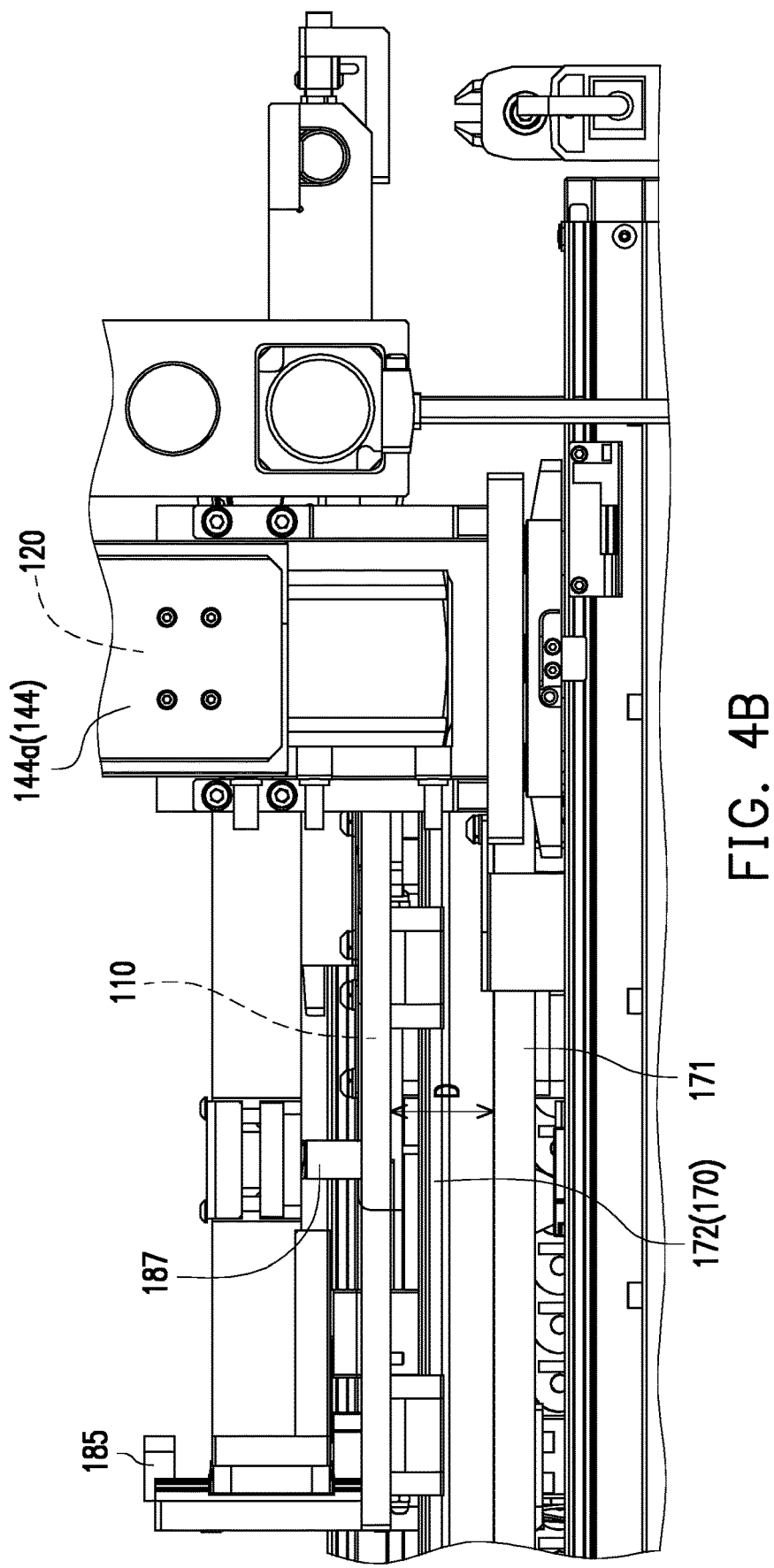
FIG. 4B is a side view of FIG. 4A.
Figure 5A:
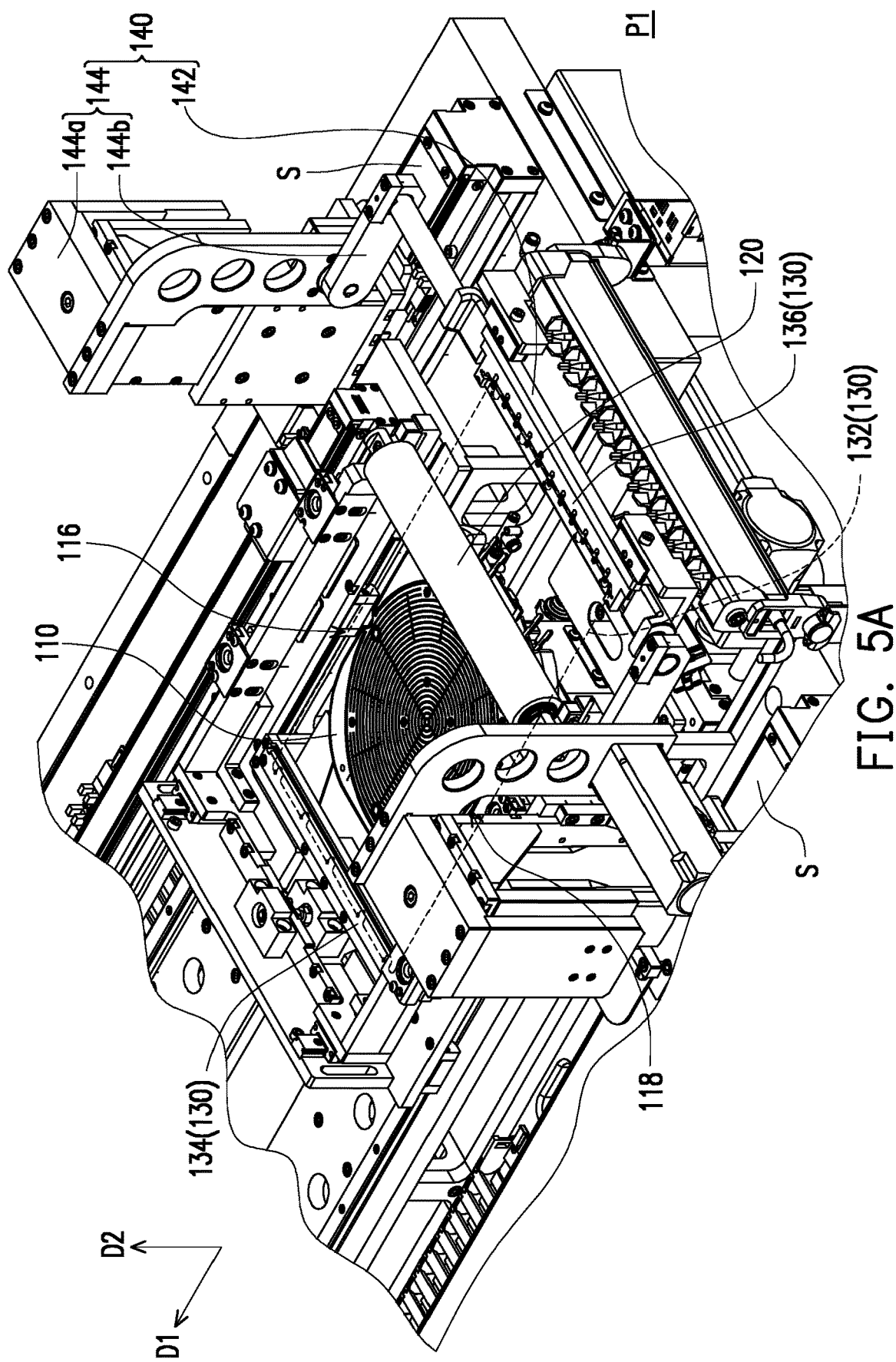
FIG. 5A is a partially enlarged perspective view of the imprinting apparatus of FIG. 1 from yet another view angle.
Figure 5B:
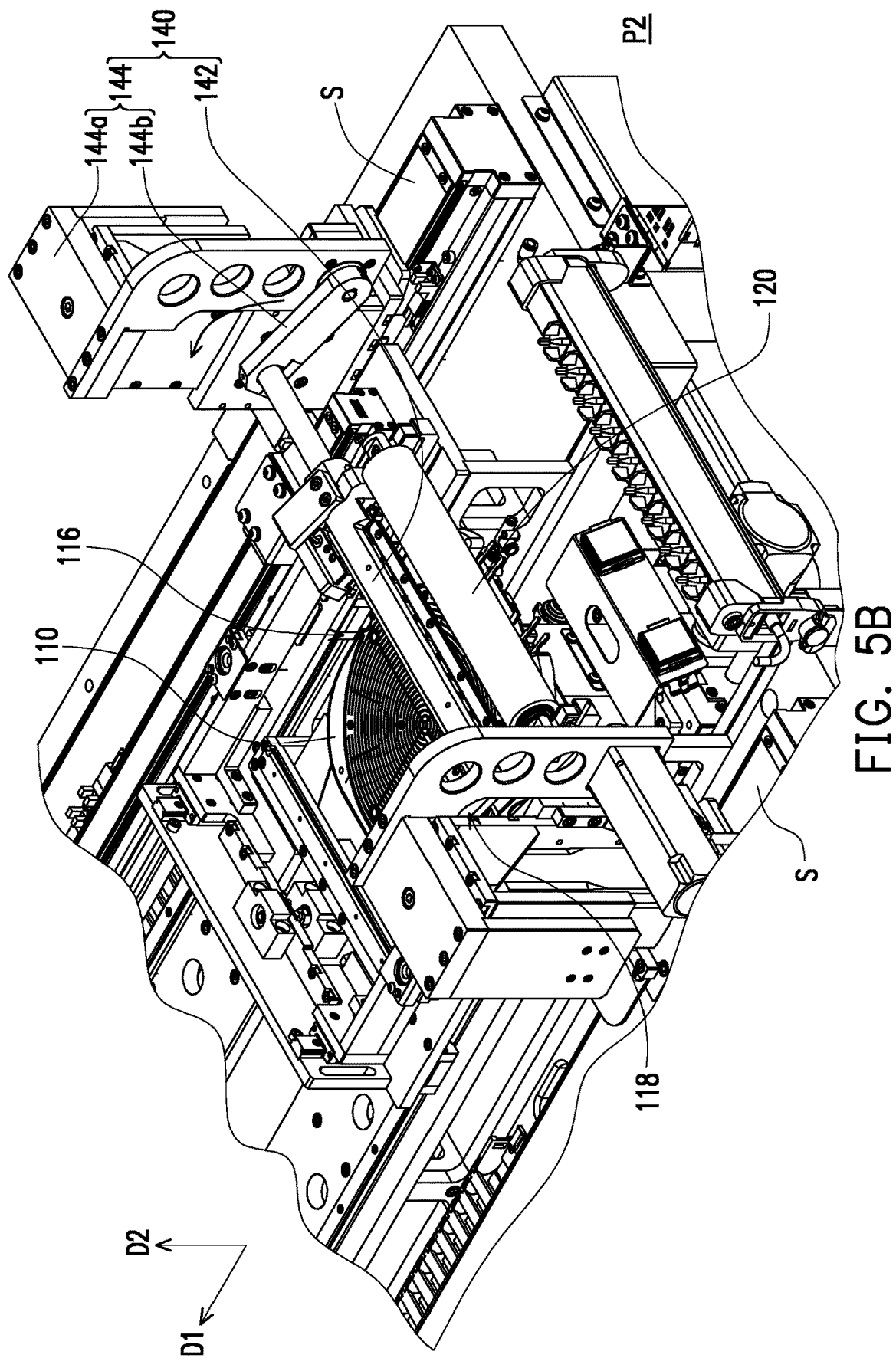
FIG. 5B is a partially enlarged perspective view showing a movable frame of a transfer module in the imprinting apparatus of FIG. 1 located in a second position.
Figure 5C:
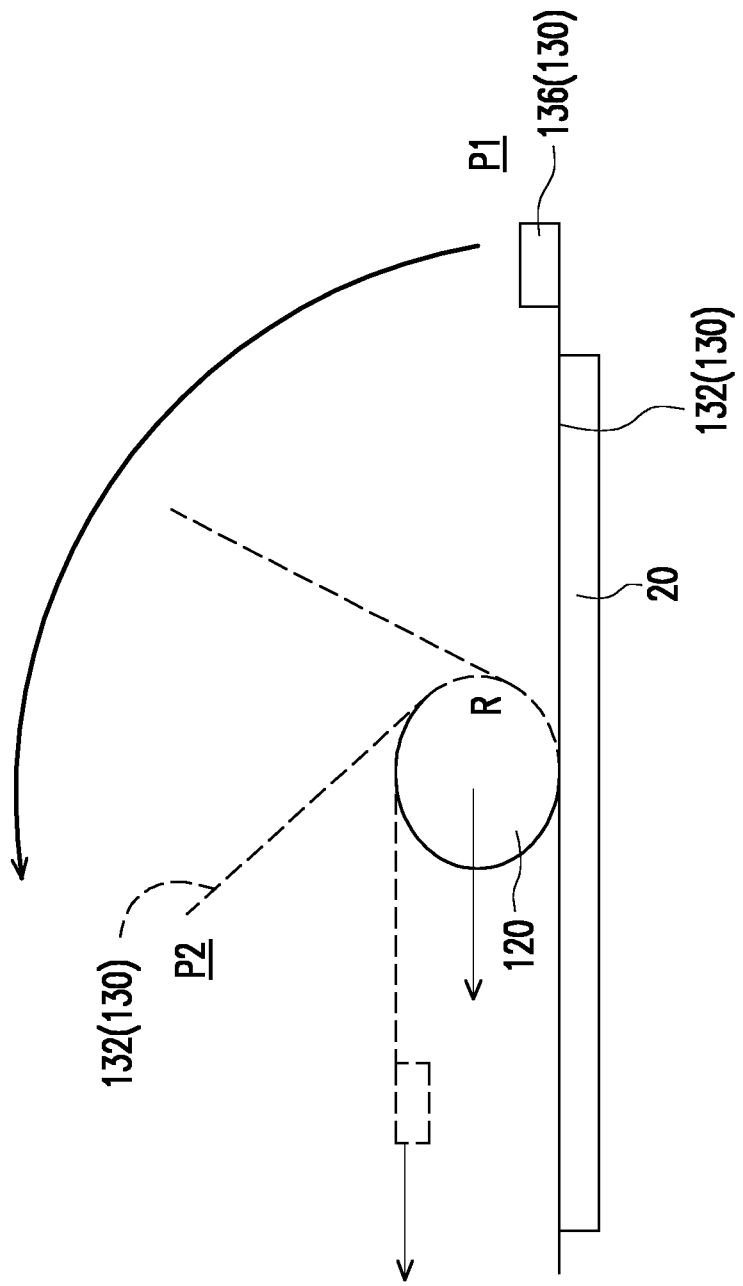
FIG. 5C is a schematic view of operation between a transfer film and an imprinting roller when a film separation module drives the movable frame to be turned.

FIG. 1 is a perspective view of an imprinting apparatus according to an embodiment of the disclosure. FIG. 2A is a perspective view of an imprinting platform and a white light interferometer in the imprinting apparatus of FIG. 1. FIG. 2B is a side view of FIG. 2A. FIG. 3 is a partial top view of the imprinting apparatus of FIG. 1. FIG. 4A is a partially enlarged perspective view of the imprinting apparatus of FIG. 1 from another view angle. FIG. 4B is a side view of FIG. 4A. FIG. 5A is a partially enlarged perspective view of the imprinting apparatus of FIG. 1 from yet another view angle. FIG. 5B is a partially enlarged perspective view showing a movable frame of a transfer module in the imprinting apparatus of FIG. 1 located in a second position. FIG. 5C is a schematic view of operation between a transfer film and an imprinting roller when a film separation module drives the movable frame to be turned. For the sake of convenience of explanation, FIG. 1, FIG. 3, FIG. 5A, and FIG. 5B are shown in a partial perspective, and some members are omitted from FIG. 2A, FIG. 3, FIG. 4A, FIG. 5A, and FIG. 5B.

With reference to FIG. 1, FIG. 2A, and FIG. 3 together, in this embodiment, an imprinting apparatus 100 includes an imprinting platform 110, an imprinting roller 120, a transfer module 130, and a film separation module 140. The imprinting platform 110 has a first side 112 and a second side 114 opposite to each other. The imprinting roller 120 is disposed above the imprinting platform 110. The transfer module 130 includes a transfer film 132 and a fixed frame 134 and a movable frame 136 that clamp opposite sides of the transfer film 132. The transfer film 132 is located between the imprinting roller 120 and the imprinting platform 110. The fixed frame 134 is fixed beside the first side 112 of the imprinting platform 110, and the movable frame 136 is disposed on the second side 114 of the imprinting platform 110. Particularly, the movable frame 136 is adapted to move horizontally relative to the fixed frame 134 to change a flatness of the transfer film 132. The film separation module 140 is connected to the movable frame 136 of the transfer module 130, and is adapted to drive the movable frame 136 to be turned from a first position P1 (with reference to FIG. 5A) to a second position P2 (with reference to FIG. 5B), such that a rounded corner R is formed between the transfer film 132 and the imprinting roller 120 (with reference to FIG. 5C). That is to say, in this embodiment, the transfer film 132 fixed with the movable frame 136 may be turned by the film separation module 140 and varied in multiple angles, such that the imprinted product structure will not be damaged due to improper film separation, thereby increasing the imprinting yield and operating convenience.

To be specific, with reference to FIG. 1, FIG. 2A and FIG. 2B, the imprinting platform 110 of this embodiment is composed of a platform 111 and a wafer 113, and is, for example but not limited to, a precision six-axis imprinting platform. Since a levelness between the imprinting platform 110 and the imprinting roller 120 may largely affect a uniform depth of the imprinted structure, the imprinting apparatus 100 of this embodiment thus also includes two white light interferometers 150 separately disposed beside the first side 112 of the imprinting platform 110 to detect a height between the imprinting roller 120 and the imprinting platform 110. To be specific, in this embodiment, through a correction jig 10 placed on the imprinting platform 110, a focus F of light emitted by the two white light interferometers 150 may first be adjusted to be presented in a horizontal line P with the imprinting platform 110 as two points defining a line. Next, the levelness between the imprinting roller 120 and the imprinting platform 110 is corrected by utilizing the white light interferometers 150 to project light of different wavelengths. In addition to projecting light of different wavelengths, the white light interferometers 150 may also detect the transfer film 132 between the imprinting roller 120 and the imprinting platform 110, and may also penetrate the transfer film 132 and detect the imprinting roller 120 above. With the height data, the imprinting roller 120 may be adjusted to be horizontal with the imprinting platform 110.

Briefly speaking, in this embodiment, with the white light interferometers 150 that projects light of different wavelengths and penetrates transparent objects (e.g., the transfer film 132), the height of the imprinting platform 110 and the imprinting roller 120 may be detected. The white light interferometers 150 adjust and confirms the levelness between the imprinting platform 110 and the imprinting roller 120 by the focal points F of the two light sources defining a straight line. The white light interferometers 150 only requires to adjust the levelness once, and the level of the imprinting roller 120 and the imprinting platform 110 may be checked in advance at each time of imprinting. Besides, since a precision of the white light interferometers 150 reaches ±0.2 μm, an error in the levelness is relatively small.

Moreover, with reference to FIG. 3, the transfer film 132 of the transfer module 130 of this embodiment is clamped by the fixed frame 134 and the movable frame 136, and the transfer film 132 has a plurality of nanostructures thereon, which are adapted to be transferred to the imprinting platform 110 through the imprinting roller 120. The fixed frame 134, as its name suggests, is a fixed frame, while the movable frame 136 is a frame movable relative to the fixed frame 134. To be specific, the movable frame 136 of the transfer module 130 includes a first portion 136*a*, a second portion 136*b*, and a plurality of elastic element 136*c*. The elastic elements 136*c* are separately connected between the first portion 136*a* and the second portion 136*b*, and the opposite sides of the transfer film 132 are clamped between the fixed frame 134 and the first portion 136*a* of the movable frame 136. Herein, the elastic elements 136*c* include, for example but not limited to, springs. That is to say, the movable frame 136 of this embodiment may be regarded as a separate and freely bendable flexible film mounting jig, and a tensile force of the elastic elements 136*c* on the jig maintains the flatness of the transfer film 132.

With reference to FIG. 1 and FIG. 3 together, in order to effectively and accurately detect the tensile force of the elastic elements 136*c*, the imprinting apparatus 100 of this embodiment further includes at least one sensor 160 (two sensors 160 shown exemplarily) disposed beside the second portion 136*b* of the movable frame 136 and configured to detect a tensile force value of the elastic elements 136*c*. The sensor 160 is, for example, a tension-compression sensor, and converts a physical signal into an electrical signal with deformation of an elastic material (e.g., a piezoelectric material) for accurate measurement. Herein, the sensor 160 may be fastened on a bearing part 142 of the film separation module 140 through a cover 165 to effectively detect the tensile force value of the elastic elements 136*c* of the movable frame 136. Whether the tensile force reaches the required value and whether the tensile force on the left and right are adjusted to be consistent are completely determined by the tensile force value detected and displayed by the sensor 160. That is to say, the sensor 160 facilitates detection and adjustment of the tensile force of the transfer film 132 on the left and right to be uniform, and facilitates detection whether the tensile force value is maintained at the force required during imprinting, as well as observes changes in the tensile force when the second portion 136*b* of the movable frame 136 is operated relative to the first portion 136*a*. The sensor 160 converts a force exerted thereon into an electrical signal output. Since a precision of the sensor 160 reaches ±0.3% RO, an error in the detected tensile force value is small.

Briefly speaking, in this embodiment, the tensile force of the elastic elements 136*c* of the movable frame 136 of the transfer module 130 maintains the flatness of the transfer film 132, the tensile force is the same on the left side and the right side, and the required tensile force value is achieved, thereby bringing in an imprinting product with an excellent structure.

With reference to FIG. 4A, the imprinting apparatus 100 of this embodiment also includes a moving platform 171, a first pair of sliding rails S1, and a moving module 170. The first pair of sliding rails S1 is disposed on the moving platform 171. The moving module 170 is slidably disposed on the first pair of sliding rails S1, and includes a carrier 172 and a bracket 174 disposed on the carrier 172. The bracket 174 includes two first bracket parts 174*a* opposite to each other and a second bracket part 174*b* connected to the two first bracket parts 174*a*. The two first bracket parts 174*a* each have a bearing slot 175, and opposite ends 122 and 124 of the imprinting roller 120 are respectively disposed in the bearing slots 175. In order to effectively control a structural depth of the product, the imprinting apparatus 100 of this embodiment also includes two sensors 180. The two sensors 180 are respectively disposed in the bearing slots 175 and located between the ends 122 and 124 of the imprinting roller 120 and the bearing slot 175, and are configured to measure a pressure value of the imprinting roller 120.

To be specific, when the moving module 170 drives the imprinting roller 120 downward to be fitted with the imprinting platform 110, a state where the imprinting platform 110 abuts against the imprinting roller 120 is formed through the moving module 170 continuously downward. However, since the sensors 180 mounted on opposite sides of the imprinting roller 120 continue to move downward as the moving module 170 is operated, a reactive tensile force is formed between the imprinting roller 120 against which the imprinting platform 110 abuts and the sensors 180, and the reactive tensile force is equal to a downward pressure exerted by the imprinting roller 120 on the imprinting platform 110. Herein, the sensors 180 are, for example, tension-compression sensors, and converts a physical signal into an electrical signal with deformation of an elastic material (e.g., a piezoelectric material) for accurate measurement. That is to say, the sensors 180 may convert the deformation due to the exerted force of the imprinting roller 120 into an electrical signal output, and may effectively detect the pressure value of the imprinting roller 120 and facilitate adjustment of the downward pressure of the imprinting roller 120 to control the structural depth of the product.

Briefly speaking, during imprinting, the configuration of the sensors 180 facilitates detection of the downward pressure value of the imprinting roller 120 and determination whether the force exerted by the imprinting roller 120 on the left and right is uniform. Moreover, through the sensors 180, the downward pressure of the imprinting roller 120 may be adjusted, and then the imprinting depth of the product may be controlled. Besides, the sensors 180 convert a force exerted thereon into an electrical signal output, and since a precision of the sensors 180 reaches ±0.3% RO, an error in the detected exerted force value is small.

With reference to FIG. 4A and FIG. 4B together, in order to further adjust the downward pressure of the imprinting roller 120, the imprinting apparatus 100 of this embodiment also includes a second pair of sliding rails S2 and an adjustable lead screw 185. The moving module 170 also includes a support plate 176 disposed on the carrier 172. The second pair of sliding rails S2 is disposed on the support plate 176, and the second bracket part 174b is slidably disposed on the second pair of sliding rails S2. An extension direction of the first pair of sliding rails S1 is perpendicular to an extension direction of the second pair of sliding rails S2. The adjustable lead screw 185 is connected to the second bracket part 174b and configured to adjust a height difference between the bracket 174 and the carrier 172. Moreover, the imprinting apparatus 100 also includes a plurality of elastic elements 187 separately disposed between the two first bracket parts 174a of the bracket 174 and the carrier 172. Herein, a distance D is present between the imprinting platform 110 and the moving platform 171, and the elastic elements 187 include, for example but not limited to, compression springs.

To be specific, during nanoimprinting, the downward pressure of the imprinting roller 120 may be a parameter that affects the microstructure of the product. The moving module 170 of this embodiment may control rising or falling of the imprinting roller 120 through the adjustable lead screw 185, and then adjust the force exerted by the imprinting roller 120 on the imprinting platform 110. In addition, the imprinting force determines the depth of microstructure of the product, and sufficient downward pressure drives air bubbles inside the resist out of the product, such that the imprinted microstructure is not affected by the air bubbles, thereby increasing the yield of products. That is to say, in this embodiment, with rising or falling of the adjustable lead screw 185, the force exerted by the imprinting roller 120 downward on the imprinting platform 110 is adjusted, and the moving module 170 is moved through the first pair of sliding rails S1 to complete the imprinting. Herein, since the adjustable lead screw 185 achieves a fine adjustment of 10 μm upward and downward, the downward pressure of the imprinting roller 120 may be precisely controlled. Besides, the elastic elements 187 are disposed to serve as a support for the cantilever deformation of the imprinting roller 120, and adjust a damping force of the rising and falling of the adjustable lead screw 185. Briefly speaking, the imprinting roller 120 adjusts the downward pressure of the imprinting roller 120 by the rising or falling of the adjustable lead screw 185, thereby controlling a force of the imprinting, with sufficient downward pressure to solve air bubble residue.

Besides, with reference to FIG. 5A, the imprinting apparatus 100 of this embodiment also includes a pair of sliding rails S disposed beside a third side 116 and a fourth side 118 of the imprinting platform 110 that are opposite to each other, and the film separation module 140 is slidably disposed on the pair of sliding rails S. The film separation module 140 of this embodiment includes the bearing part 142 and a turning mechanism 144. The movable frame 136 of the transfer module 130 is assembled on the bearing part 142. The turning mechanism 144 includes two adjustable body parts 144a and two hinge parts 144b respectively connected to the two adjustable body parts 144a. The hinge parts 144b are respectively connected to opposite sides of the bearing part 142, and the two adjustable body parts 144a are adapted to slide along the pair of sliding rails S in a first direction D1 and are adapted to move along a second direction D2 perpendicular to the first direction D1 to adjust a distance between the transfer film 132 and the imprinting platform 110.

To be specific, with reference to FIG. 5A again, when film separation is required for the transfer film 132 after imprinting, at this time, the movable frame 136 connected to the bearing part 142 of the film separation module 140 is located in the first position P1. Next, with reference to FIG. 5B and FIG. 5C together, the turning mechanism 144 of the film separation module 140 drives the movable frame 136 and the transfer film 132 fixed with the movable frame 136 to be turned such that the rounded corner R is formed between the transfer film 132 and the imprinting roller 120, and the movable frame 136 is located in the second position P2. At this time, the imprinting roller 120 and the turning mechanism 144 move to the left (i.e., to the first side 112 of the imprinting platform 110) at substantially the same speed, and the rounded corner R may offset a pulling force when the transfer film 132 is separated from a product 20, such that the structures of the transfer film 132 and the product 20 can be separated smoothly. That is to say, the imprinting apparatus 100 of this embodiment includes the movable frame 136, which can be freely bent, the film separation module 140, which turns and bends the transfer film 132 and adjusts the angle/height to perform separation between the transfer film 132 and the product 20, and the imprinting roller 120, of which continuous peeling of the rounded corner R prevents damage to the imprinted product 20 due to separation by a fierce pull, thereby increasing the imprinting yield. In other words, in this embodiment, with the mechanical design of the film separation module 140, film separations with great variations may thus be performed and adjustment to the most suitable film separation angle may be achieved, preventing improper damage to the microstructure of the product by the transfer film 132 and increasing the yield of products. Besides, in this embodiment, in addition to turning the transfer film 132 and varying the same in multiple angles, the film separation module 140 may also adjust various film separations, in combination with the turning mechanism 144 that moves in the second direction D2 to fine-tune the distance between the transfer film 132 and the imprinting platform 110, namely a height to which the turning mechanism 144 may rise. Therefore, the imprinted product structure would not be damaged due to improper film separation, thereby increasing the imprinting yield.

Briefly speaking, the film separation module 140 of this embodiment may turn the transfer film 132 fixed with the movable frame 136 and vary the transfer film 132 in multiple angles, and achieves adjustment to the most suitable film separation angle, such that the imprinted product structure would not be damaged due to improper film separation, thereby increasing the imprinting yield and operating convenience. Moreover, in this embodiment, through the white light interferometers 150, levelness between the imprinting platform 110 and the imprinting roller 120 is precisely achieved, through the sensor 160, the tensile force of the elastic elements 136c of the movable frame 136 of the transfer module 130 can be accurately detected, and through the sensors 180, the pressure value of the imprinting roller 120 is effectively detected and the downward pressure of the imprinting roller 120 is adjusted, thereby controlling the structural depth of the product. Besides, the downward pressure of the imprinting roller 120 may also be adjusted through the rising or falling of the adjustable lead screw 185, thereby controlling the force of the imprinting, with sufficient downward pressure to solve air bubble residue. In other words, in this embodiment, the imprinting and film separation of the imprinting apparatus 100 are optimized, thereby increasing the imprinting yield and operating convenience of the imprinting apparatus 100. In addition, through the above-mentioned mechanical design, the imprinting apparatus 100 of this embodiment adjusts film separation with a high degree of freedom, and can find out the most suitable peeling manner for the product 20 and the transfer film 132. Moreover, the multi-axis structure facilitates detailed testing and fine-tuning, preventing damage to the imprinted product 20 due to improper film separation in a single way, and increasing the yield of products.

Notably, the reference numerals and part of the contents in the above embodiments remain to be used in following embodiment, where the same reference numerals are adopted to refer to the same or similar elements, and description of the same technical contents is omitted. Reference may be made to the above embodiments for the description of the omitted part, which will not be repeatedly described in the following embodiment.

Figure 6A:
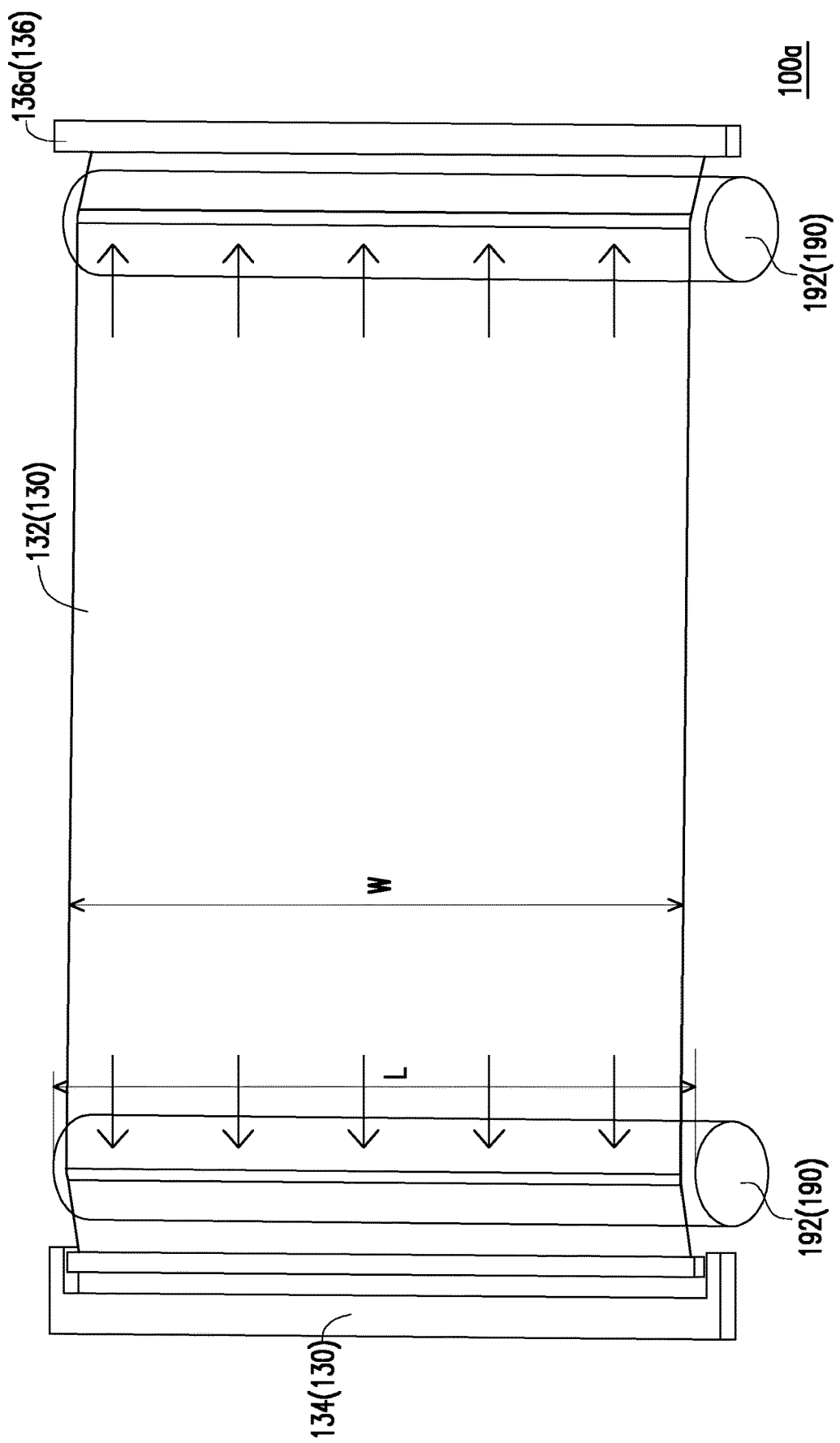
FIG. 6A is a schematic top view of an imprinting apparatus according to another embodiment of the disclosure.
Figure 6B:
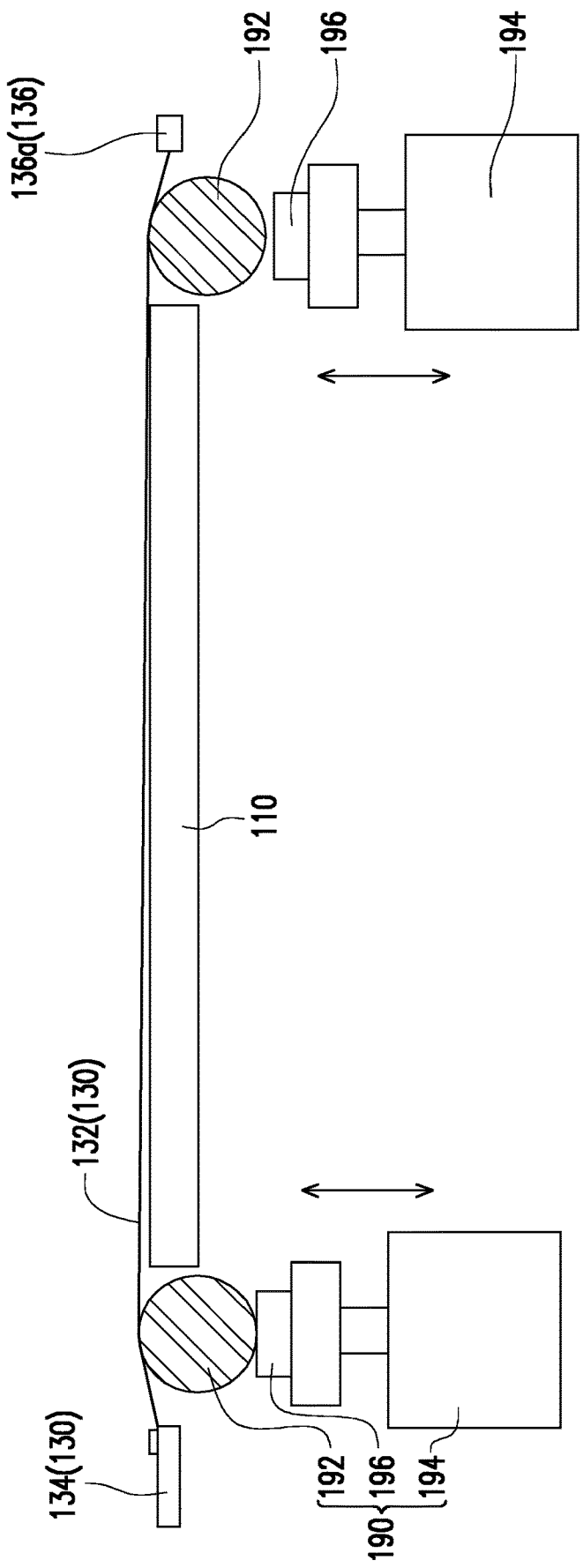
FIG. 6B is a schematic side view of the imprinting apparatus of FIG. 6A.

FIG. 6A is a schematic top view of an imprinting apparatus according to another embodiment of the disclosure. FIG. 6B is a schematic side view of the imprinting apparatus of FIG. 6A. For ease of description, only part of the members are schematically illustrated in FIG. 6A and FIG. 6B, and reference may be made to the relevant drawings to the above embodiments for the omitted part. With reference to FIG. 3-FIG. 6A, and FIG. 6B together, an imprinting apparatus 100a of this embodiment is similar to the imprinting apparatus 100, and is different in that the imprinting apparatus 100a of this embodiment also includes a tensile force adjustment mechanism 190, which includes two rotating axles 192 and two lifting machines 194. An extension direction of the two rotating axles 192 is parallel to an extension direction of the imprinting roller 120. The two rotating axles 192 are in contact against the transfer film 132 and are respectively located between of the fixed frame 134 of the transfer module 130 and the imprinting platform 110 and between the first portion 136a of the movable frame 136 of the transfer module 130 and the imprinting platform 110. The two lifting machines 194 respectively adjust lifted heights of the two rotating axles 192, and the transfer film 132 is pulled open through lifting by the two rotating axles 192 to generate a tensile force. In other words, the rotating axles 192 at the longitudinal front and back may be lifted by using the lifting machines 194 (e.g., an electric cylinder) to tighten the transfer film 132 and generate a tensile force. In addition, the strength of the tensile force of the transfer film 132 at the front and back may be independently adjusted depending on the lifted heights of the rotating axles 192.

Moreover, the tension adjustment mechanism 190 of this embodiment also includes two tensile force sensors 196. The two tensile force sensors 196 are respectively disposed between the two rotating axles 192 and the two lifting machines 194, and may be configured to detect a real-time tensile force of the transfer film 132. Preferably, in this embodiment, a length L of each of the rotating axles 192 is greater than a width W of the transfer film 132. In this embodiment, since the length L of the rotating axles 192 is greater than the width of the transfer film 132, and the rotating axles 192 are in contact against the transfer film 132 to form an even tensile force along a straight line, the tensile force may be evenly transmitted to lateral sides (i.e., along the directions of the arrows in FIG. 6A) of the transfer film 132.

Briefly speaking, in the mechanism of the tension adjustment mechanism 190 of this embodiment, the two rotating axles 192 are mounted at the longitudinal front and back of the transfer film 132, and the transfer film is pulled open using the lifting by the rotating axles 192 to generate the tensile force. Beneath the rotating axles 192, the tensile force sensors 196 may be additionally mounted to detect the real-time tensile force of the transfer film 132, and the tightness (i.e., the tensile force) is adjusted with the lifting amplitude of the rotating axles 192. Furthermore, since each of the rotating axles 192 is disposed corresponding to one lifting machine 194, longitudinal front and back sides of the transfer film 132 may be independently adjusted. In addition, since the length L of each of the rotating axles 192 is greater than the width W of the transfer film 132, when the rotating axles 19 pull open the transfer film 132 in a linear manner, the tensile force are formed along a straight line and evenly distributed on the lateral sides of the transfer film 132.

In summary of the foregoing, in the imprinting apparatus of the disclosure, the film separation module is connected to the movable frame of the transfer module, and is adapted to drive the movable frame to be turned from the first position to the second position, such that the rounded corner is formed between the transfer film and the imprinting roller. That is, the film separation module may turn the transfer film fixed with the movable frame and vary the transfer film in multiple angles, such that the imprinted product structure would not be damaged due to improper film separation, thereby increasing the imprinting yield and operating convenience.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An imprinting apparatus, comprising:
    an imprinting platform having a first side and a second side opposite to each other;
    an imprinting roller disposed above the imprinting platform;
    a transfer module comprising a transfer film and a fixed frame and a movable frame that clamp opposite sides of the transfer film, wherein the transfer film is located between the imprinting roller and the imprinting platform, the fixed frame is fixed beside the first side of the imprinting platform, the movable frame is disposed on the second side of the imprinting platform, and the movable frame is adapted to move horizontally relative to the fixed frame to change a flatness of the transfer film;
    a film separation module connected to the movable frame of the transfer module, and being adapted to drive the movable frame to be turned from a first position to a second position, such that a rounded corner is formed between the transfer film and the imprinting roller;
    a moving platform;

a first pair of sliding rails disposed on the moving platform;

a moving module slidably disposed on the first pair of sliding rails, and comprising a carrier and a bracket disposed on the carrier, wherein the bracket comprises two first bracket parts opposite to each other and a second bracket part connected to the two first bracket parts, each of the two first bracket parts has a bearing slot, and opposite ends of the imprinting roller are respectively disposed in the bearing slot of each of the two first bracket parts;

a second pair of sliding rails, wherein the moving module further comprises a support plate disposed on the carrier, the second pair of sliding rails is disposed on the support plate, and the second bracket part is slidably disposed on the second pair of sliding rails, wherein an extension direction of the first pair of sliding rails is perpendicular to an extension direction of the second pair of sliding rails; and an adjustable lead screw connected to the second bracket part and configured to adjust a height difference between the bracket and the carrier.

2. The imprinting apparatus according to claim 1, further comprising:
two white light interferometers separately disposed beside the first side of the imprinting platform to detect a height between the imprinting roller and the imprinting platform.

3. The imprinting apparatus according to claim 1, wherein the movable frame of the transfer module comprises a first portion, a second portion, and a plurality of elastic elements, wherein the elastic elements are separately connected between the first portion and the second portion, and the opposite sides of the transfer film are clamped between the fixed frame and the first portion of the movable frame.

4. The imprinting apparatus according to claim 3, wherein the elastic elements comprise a plurality of springs.

5. The imprinting apparatus according to claim 3, further comprising:
at least one tension-compression sensor disposed beside the second portion of the movable frame and configured to detect a tensile force value of the elastic elements.

6. The imprinting apparatus according to claim 1, further comprising:
two tension-compression sensors respectively disposed in the bearing slot of each of the two first bracket parts and located between the ends of the imprinting roller and the bearing slots, and configured to measure a pressure value of the imprinting roller.

7. The imprinting apparatus according to claim 1, further comprising:

a plurality of elastic elements separately disposed between the two first bracket parts of the bracket and the carrier.

8. The imprinting apparatus according to claim 7, wherein the elastic elements comprise a plurality of compression springs.

9. The imprinting apparatus according to claim 1, wherein a distance is present between the imprinting platform and the moving platform.

10. The imprinting apparatus according to claim 1, further comprising:
a pair of sliding rails disposed beside a third side and beside a fourth side of the imprinting platform, wherein the third side and the fourth side are opposite to each other, and the film separation module is slidably disposed on the pair of sliding rails.

11. The imprinting apparatus according to claim 10, wherein the film separation module comprises:
a bearing part, wherein the movable frame of the transfer module is assembled on the bearing part; and
a turning mechanism comprising two adjustable body parts and two hinge parts connected to the two adjustable body parts, wherein the two hinge parts are respectively connected to opposite sides of the bearing part, and the two adjustable body parts are adapted to slide along the pair of sliding rails in a first direction and are adapted to move along a second direction perpendicular to the first direction to adjust a distance between the transfer film and the imprinting platform.

12. The imprinting apparatus according to claim 1, further comprising
a tensile force adjustment mechanism, comprising two rotating axles and two lifting machines, wherein an extension direction of the two rotating axles is parallel to an extension direction of the imprinting roller, the two rotating axles are in contact against the transfer film and are respectively located between the fixed frame of the transfer module and the imprinting platform and between the movable frame of the transfer module and the imprinting platform, the two lifting machines respectively adjust lifted heights of the two rotating axles, and the transfer film is pulled open through lifting by the two rotating axles to generate a tensile force.

13. The imprinting apparatus according to claim 12, wherein a length of each of the rotating axles is greater than a width of the transfer film.

14. The imprinting apparatus according to claim 12, wherein the tensile force adjustment mechanism further comprises two tensile force sensors respectively disposed between the two rotating axles and the two lifting machines to detect a real-time tensile force of the transfer film.

* * * * *